US012196816B2

(12) United States Patent
Jin et al.

(10) Patent No.: US 12,196,816 B2
(45) Date of Patent: Jan. 14, 2025

(54) SYSTEM AND METHOD FOR DIAGNOSING ABNORMALITY OF VEHICLE BATTERY

(71) Applicants: Hyundai Motor Company, Seoul (KR); Kia Corporation, Seoul (KR)

(72) Inventors: Dae Gun Jin, Hwaseong-si (KR); Woo Sung Kim, Hwaseong-si (KR); Kyung In Min, Hwaseong-si (KR); Do Sung Hwang, Hwaseong-si (KR); Ki Seung Baek, Hwaseong-si (KR); Dong Il Kim, Hwaseong-si (KR); Yoon Jun Lee, Hwaseong-si (KR); Bo Ram Yang, Hwaseong-si (KR); Ki Chul Hong, Hwaseong-si (KR); Ik Kyu Kim, Hwaseong-si (KR); Sung Il Lee, Hwaseong-si (KR); Jae Shin Yi, Hwaseong-si (KR); Young Woo Lee, Hwaseong-si (KR); Soo Yang Jin, Hwaseong-si (KR); Suk Hyung Kim, Hwaseong-si (KR); Hyun Soo Park, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 537 days.

(21) Appl. No.: 17/520,065

(22) Filed: Nov. 5, 2021

(65) Prior Publication Data
US 2022/0144132 A1 May 12, 2022

Related U.S. Application Data

(60) Provisional application No. 63/110,744, filed on Nov. 6, 2020.

(51) Int. Cl.
*H01M 10/44* (2006.01)
*B60L 3/00* (2019.01)
(Continued)

(52) U.S. Cl.
CPC .......... *G01R 31/389* (2019.01); *B60L 3/0046* (2013.01); *B60L 50/60* (2019.02);
(Continued)

(58) Field of Classification Search
CPC ........ H02J 7/00; H02J 7/0048; G01R 31/389; G01R 31/3835; G01R 31/392; B60L 58/12; B60L 58/21; B60L 2250/16
(Continued)

(56) References Cited

U.S. PATENT DOCUMENTS 7,154,247 B2  12/2006  Kikuchi et al.
7,456,612 B2  11/2008  Murakami
(Continued)

FOREIGN PATENT DOCUMENTS

CA    2 851 503 A1    4/2013
CN    103229346 A     7/2013
(Continued)

OTHER PUBLICATIONS

Machine translation CN-203909253-U (Oct. 29, 2014) (Year: 2014).*
(Continued)

*Primary Examiner* — Edward Tso
(74) *Attorney, Agent, or Firm* — Morgan, Lewis & Bockius LLP

(57) ABSTRACT

Disclosed is a system for managing a vehicle battery that is chargeable/dischargeable and stores energy for driving a vehicle driving motor. The system for managing the vehicle battery as disclosed includes a controller that measures a polarization voltage of each of a plurality of battery cells in a vehicle battery after charging of the vehicle battery is terminated, and determines whether each of the plurality of battery cells is abnormal based on the measured polarization voltage.

20 Claims, 5 Drawing Sheets

(51) Int. Cl.
*B60L 50/60* (2019.01)
*B60L 58/10* (2019.01)
*B60L 58/12* (2019.01)
*B60L 58/16* (2019.01)
*B60L 58/21* (2019.01)
*G01R 31/367* (2019.01)
*G01R 31/3835* (2019.01)
*G01R 31/3842* (2019.01)
*G01R 31/389* (2019.01)
*G01R 31/392* (2019.01)
*G07C 5/00* (2006.01)
*G07C 5/08* (2006.01)
*H01M 10/42* (2006.01)
*H01M 10/46* (2006.01)
*H01M 10/48* (2006.01)
*G05B 23/02* (2006.01)

(52) U.S. Cl.
CPC ............ *B60L 58/10* (2019.02); *B60L 58/12* (2019.02); *B60L 58/16* (2019.02); *B60L 58/21* (2019.02); *G01R 31/367* (2019.01); *G01R 31/3835* (2019.01); *G01R 31/3842* (2019.01); *G01R 31/392* (2019.01); *G07C 5/008* (2013.01); *G07C 5/0825* (2013.01); *H01M 10/425* (2013.01); *H01M 10/482* (2013.01); *H01M 10/486* (2013.01); *B60L 2240/545* (2013.01); *B60L 2240/547* (2013.01); *G05B 23/0218* (2013.01); *G05B 23/0256* (2013.01); *H01M 2010/4271* (2013.01); *H01M 2220/20* (2013.01)

(58) Field of Classification Search
USPC .................. 320/104, 107, 116, 132, 149
See application file for complete search history.

(56) References Cited

U.S. PATENT DOCUMENTS

| | | | |
|---|---|---|---|
| 7,589,492 | B2 | 9/2009 | Ooishi et al. |
| 7,821,234 | B2 | 10/2010 | Moriya |
| 7,893,652 | B2 | 2/2011 | Suzuki et al. |
| 7,990,109 | B2 | 8/2011 | White et al. |
| 8,000,915 | B2 | 8/2011 | Furukawa et al. |
| 8,219,333 | B2 | 7/2012 | Li |
| 8,878,493 | B2 | 11/2014 | Kobayashi et al. |
| 9,461,320 | B2 | 10/2016 | Ballantine et al. |
| 9,465,084 | B2 | 10/2016 | Park |
| 9,577,458 | B2 | 2/2017 | Kaita et al. |
| 9,685,807 | B2 | 6/2017 | Nakao et al. |
| 9,720,047 | B2 | 8/2017 | Joe |
| 10,132,868 | B2 | 11/2018 | Sun et al. |
| 10,261,136 | B2 | 4/2019 | Hosaka et al. |
| 10,830,829 | B2 | 11/2020 | Gelso et al. |
| 11,316,352 | B2 | 4/2022 | Hale |
| 11,491,877 | B2 | 11/2022 | Sato |
| 11,691,518 | B2 | 7/2023 | Holme |
| 12,024,052 | B2 | 7/2024 | Kim |
| 2004/0178798 | A1 | 9/2004 | Kikuchi et al. |
| 2006/0186890 | A1 | 8/2006 | Iwane et al. |
| 2007/0052424 | A1 | 3/2007 | Okumura |
| 2008/0053715 | A1 | 3/2008 | Suzuki et al. |
| 2009/0271132 | A1 | 10/2009 | Furukawa et al. |
| 2010/0224157 | A1 | 9/2010 | Mizuno |
| 2011/0006731 | A1 | 1/2011 | Wang et al. |
| 2012/0019253 | A1 | 1/2012 | Ziegler et al. |
| 2012/0112703 | A1 | 5/2012 | Xu et al. |
| 2013/0141109 | A1 | 6/2013 | Love et al. |
| 2013/0342212 | A1 | 12/2013 | Kawahira et al. |
| 2014/0159738 | A1 | 6/2014 | Jeong et al. |
| 2014/0218042 | A1 | 8/2014 | Koba et al. |
| 2014/0333315 | A1 | 11/2014 | Yamamoto |
| 2015/0228990 | A1 | 8/2015 | Ballantine et al. |
| 2015/0288197 | A1 | 10/2015 | Choi |
| 2016/0069963 | A1 | 3/2016 | Hebiguchi |
| 2017/0018823 | A1 | 1/2017 | Kwon |
| 2017/0160327 | A1 | 6/2017 | Jung et al. |
| 2017/0279164 | A1 | 9/2017 | Herrema et al. |
| 2018/0062210 | A1 | 3/2018 | Kim |
| 2018/0106869 | A1 | 4/2018 | Gelso et al. |
| 2019/0146040 | A1 | 5/2019 | Murakami et al. |
| 2020/0072909 | A1 | 3/2020 | Soejima et al. |
| 2020/0096572 | A1 | 3/2020 | You et al. |
| 2020/0158784 | A1 | 5/2020 | Fabregas et al. |
| 2020/0326378 | A1 | 10/2020 | Oono et al. |
| 2020/0391610 | A1 | 12/2020 | Park et al. |
| 2020/0412153 | A1 | 12/2020 | Matsumura et al. |
| 2021/0231743 | A1 | 7/2021 | Christopherson |
| 2022/0111759 | A1 | 4/2022 | Ijaz |
| 2022/0149630 | A1 | 5/2022 | Burchardt |

FOREIGN PATENT DOCUMENTS

| | | | | |
|---|---|---|---|---|
| CN | 203909253 | U | * 10/2014 | |
| CN | 106772099 | A | 5/2017 | |
| CN | 109613432 | A | 4/2019 | |
| DE | 10 2015 203 878 | A1 | 9/2016 | |
| DE | 10 2019 110 349 | A1 | 10/2020 | |
| EP | 0 438 477 | B1 | 9/1995 | |
| EP | 1 316 458 | A1 | 6/2003 | |
| EP | 1 846 776 | A1 | 10/2007 | |
| EP | 1 919 059 | A2 | 5/2008 | |
| EP | 2 403 105 | A2 | 1/2012 | |
| EP | 4095957 | A1 | * 11/2022 | ........ H01M 8/04305 |
| FR | 3 029 299 | A1 | 6/2016 | |
| JP | 2002-008733 | A | 1/2002 | |
| JP | 2002-084666 | A | 3/2002 | |
| JP | 2004-328902 | A | 11/2004 | |
| JP | 2006-292565 | A | 10/2006 | |
| JP | 2007-085772 | A | 4/2007 | |
| JP | 2007-292666 | A | 11/2007 | |
| JP | 2007-333494 | A | 12/2007 | |
| JP | 2009-190690 | A | 8/2009 | |
| JP | 4919120 | B2 | 4/2012 | |
| JP | 2013-083522 | A | 5/2013 | |
| JP | 2014-134467 | A | 7/2014 | |
| JP | 2018-181430 | A | 11/2018 | |
| JP | 6566425 | B2 | 8/2019 | |
| KR | 10-20080074240 | A | 8/2008 | |
| KR | 10-2012-0016993 | A | 2/2012 | |
| KR | 10-2013-0061964 | A | 6/2013 | |
| KR | 10-2013-0075379 | A | 7/2013 | |
| KR | 10-2014-0075983 | A | 6/2014 | |
| KR | 10-2014-0093122 | A | 7/2014 | |
| KR | 10-2014-0122520 | A | 10/2014 | |
| KR | 10-2015-0052384 | A | 5/2015 | |
| KR | 10-1558696 | B1 | 10/2015 | |
| KR | 10-1755910 | B1 | 7/2017 | |
| KR | 10-2017-0109435 | A | 9/2017 | |
| KR | 10-1818515 | B1 | 1/2018 | |
| KR | 10-2018-0056091 | A | 5/2018 | |
| KR | 10-2018-0067140 | A | 6/2018 | |
| KR | 10-1942707 | B1 | 1/2019 | |
| KR | 10-1955537 | B1 | 3/2019 | |
| KR | 10-2017573 | B1 | 9/2019 | |
| KR | 10-2020-0022639 | A | 3/2020 | |
| KR | 10-2020-0038005 | A | 4/2020 | |
| KR | 10-2020-0143019 | A | 12/2020 | |
| KR | 10-2229019 | B1 | 3/2021 | |
| KR | 10-2022-0006270 | A | 1/2022 | |
| KR | 10-2022-0012483 | A | 2/2022 | |
| KR | 10-2022-0060083 | A | 5/2022 | |
| TW | I404644 | B | 8/2013 | |
| WO | 2006/082425 | A1 | 8/2006 | |
| WO | 2015/123304 | A1 | 8/2015 | |
| WO | 2016/071801 | A1 | 5/2016 | |

(56) References Cited

FOREIGN PATENT DOCUMENTS

WO    2016/147326 A1    9/2016
WO    2019/008367 A1    1/2019

OTHER PUBLICATIONS

Office Action issued on Feb. 27, 2024 in U.S. Appl. No. 17/518,986.
Koch et al. (2014), Electrochemical Impedance Spectroscopy for Online Battery Monitoring—Power Electronics Control, 16th European Conference on Power Electronics and Applications.
Christensen et al. (2013), Using on-board Electrochemical Impedance Spectroscopy in Battery Management Systems, EVS27 Barcelona, Spain.
Takeno et al. (2004), Quick testing of batteries in lithium-ion battery packs with impedance-measuring technology, Journal of Power Sources, 128: 67-75.
U.S.Office Action dated Jan. 3, 2023, issued in corresponding U.S. Appl. No. 17/518,986.
U.S.Final Office Action dated Jun. 26, 2023, issued in corresponding U.S. Appl. No. 17/518,986.
Office Action issued on Jul. 11, 2024 in U.S. Appl. No. 17/518,991.
Office Action issued Jul. 19, 2024 in U.S. Appl. No. 17/520,013.
Office Action issued on Sep. 25, 2024 in U.S. Appl. No. 17/520,007.
Notice of Allowance issued on Nov. 20, 2024 in U.S. Appl. No. 17/520,013.

\* cited by examiner

SYSTEM AND METHOD FOR DIAGNOSING ABNORMALITY OF VEHICLE BATTERY

CROSS-REFERENCE TO RELATED APPLICATION

This application is a non-provisional patent application of the provisional patent application No. 63/110,744 filed on Nov. 6, 2020, the disclosures of which are incorporated herein by reference in their entirety.

BACKGROUND OF THE INVENTION

Field of the Invention

The present invention relates to a system and method for managing a vehicle battery, and more particularly, to a system and method for managing a vehicle battery that effectively monitors a state of a battery in a parking state of a vehicle after charging the battery of the vehicle, so that various problems occurring in the battery in the vehicle parking state can be prevented in advance.

Description of the Related Art

In general, an eco-friendly vehicle driven using electric energy is a vehicle that generates power by driving a motor, which is an electric rotation mechanism, using the electric energy stored in a battery. The dynamic performance of such an eco-friendly vehicle is closely related to the performance of the battery, so efficient monitoring and management of the battery is essential.

In general, the battery of an eco-friendly vehicle is managed by a controller commonly referred to as a battery management system (BMS). The battery management system collects various information for battery management (battery voltage, battery current, battery temperature, etc.) from the battery and applies the collected information to various prestored algorithms to calculate various parameters for battery management.

A conventional vehicle battery management technique is mainly performed in a state in which power is supplied to the battery management system, that is, in a power-on (IG ON) state. That is, a main relay connected to the battery monitors the state of the battery in a state in which an electrical connection between the battery and other components of the vehicle (for example, a power module that converts power from the battery to provide it to a motor or a charger that generates power for charging the battery) is established.

As described above, in the conventional vehicle battery management technique, since information for battery management is collected in a state in which the battery and other components are electrically connected, there is a problem in that the collected information is affected by other components, thereby preventing accurate battery condition monitoring.

In particular, in recent years, fatal accidents such as a fire occurring in a battery in a parking state of a vehicle occur frequently, so a technique that can determine in advance whether a battery is abnormal in a parking state of a vehicle and warn it before an accident occurs is required in a relevant technical field.

The matters described as the background art above are only for improving the understanding of the background of the present invention, and should not be taken as acknowledging that they correspond to the prior art already known to those of ordinary skill in the art.

SUMMARY OF THE INVENTION

Accordingly, a technical object of the present invention is to provide a system and method for managing a vehicle battery capable of predetermining whether a battery is abnormal even when the battery is in a no-load state after charging the battery in a vehicle and warning it.

In order to achieve the above object, the present invention provides a system for managing a vehicle battery that is chargeable/dischargeable and stores energy for driving a vehicle driving motor, including a controller that measures a polarization voltage of each of a plurality of battery cells in a vehicle battery after charging of the vehicle battery is terminated, and determines whether each of the plurality of battery cells is abnormal based on the measured polarization voltage.

In an embodiment of the present invention, the controller may measure the polarization voltage when a charging current applied to the vehicle battery is cut off and the vehicle battery is in a no-load state.

In an embodiment of the present invention, the controller may compare the polarization voltage of each of the plurality of battery cells with a preset reference value, respectively, and may determine the battery cell having the polarization voltage greater than the reference value as the battery cell in which abnormality is occurred.

In an embodiment of the present invention, the controller may measure a first polarization voltage of each of the plurality of battery cells corresponding to a decrease in voltage of the vehicle battery for a preset time interval from a time point when the charging of the vehicle battery is terminated, and may measure a second polarization voltage of each of the plurality of battery cells corresponding to the decrease in voltage of the vehicle battery at least once during the present time interval after measuring the first polarization voltage.

In an embodiment of the present invention, the controller may compare the first polarization voltage of each of the plurality of battery cells with a preset first reference value, respectively, or may compare the second polarization voltage of each of the plurality of battery cells with a preset second reference value, respectively, and may determine the battery cell in which the first polarization voltage is greater than the first reference value or the second polarization voltage is greater than the second reference value as the battery cell in which abnormality is occurred.

In an embodiment of the present invention, the reference value may be preset for each charging current of the vehicle battery, and when the charging of the vehicle battery is terminated, the controller may calculate an average value of a charging current applied to the vehicle battery, and may compare the reference value corresponding to the calculated average value of the charging current with the polarization voltage of each of the plurality of battery cells.

In an embodiment of the present invention, the controller may measure the polarization voltage corresponding to a decrease in voltage of each of the plurality of battery cells in the vehicle battery for a present time interval immediately after the charging of the vehicle battery is terminated, may establish an internal resistance of each of the plurality of battery cells based on the polarization voltage and a magnitude of a charging current applied to the vehicle battery immediately before the charging of the vehicle battery is terminated, and may determine whether each of the battery cells is abnormal based on the estimated internal resistance.

In an embodiment of the present invention, the controller may determine the battery cell in which a difference or ratio of the estimated internal resistance of each of the battery cells and a preset initial internal resistance of the battery cell is greater than a preset reference value as the battery cell in which abnormality is occurred.

In an embodiment of the present invention, the initial internal resistance is preset for each temperature and state of charge of the battery cells, and the controller may receive the temperature of each of the plurality of battery cells, may calculate the state of charge of each of the plurality of battery cells, may determine whether the battery cell is abnormal by applying the initial internal resistance corresponding to the received temperature and the calculated state of charge.

In an embodiment of the present invention, the system may further include a cluster or an audio video navigation (AVN) that displays information on the battery cell determined to be abnormal by the controller.

In an embodiment of the present invention, the information may include an identifier of the battery cell determined to be abnormal and a magnitude of the polarization voltage of the battery cell determined to be abnormal.

In an embodiment of the present invention, the cluster or the AVN may include a communication module that wirelessly transmits the information on the battery cell determined to be abnormal to a vehicle management server or a wireless terminal of a driver of the vehicle.

In order to achieve the above object, the present invention provides a method for managing a vehicle battery that is chargeable/dischargeable and stores energy for driving a vehicle driving motor, the method comprising the steps of measuring a polarization voltage of each of a plurality of battery cells in a vehicle battery after charging of the vehicle battery is terminated; comparing the measured polarization voltage with a present reference value; and determines the battery cell in which the measured polarization voltage is greater than the reference value as the battery cell in which abnormality is occurred.

In an embodiment of the present invention, the step of measuring the polarization voltage may be the step of measuring the polarization voltage when a charging current applied to the vehicle battery is cut off and the vehicle battery is in a no-load state.

In an embodiment of the present invention, the step of measuring the polarization voltage may include the steps of measuring a first polarization voltage of each of the plurality of battery cells corresponding to a decrease in voltage of the vehicle battery for a preset time interval from a time point when the charging of the vehicle battery is terminated, and measuring a second polarization voltage of each of the plurality of battery cells corresponding to the decrease in voltage of the vehicle battery at least once during the present time interval after measuring the first polarization voltage.

In an embodiment of the present invention, the step of comparing may include the step of comparing the first polarization voltage of each of the plurality of battery cells with a preset first reference value, respectively, or compares the second polarization voltage of each of the plurality of battery cells with a preset second reference value, respectively, and the step of determining may include the step of determining the battery cell in which the first polarization voltage is greater than the first reference value or the second polarization voltage is greater than the second reference value as the battery cell in which abnormality is occurred.

In an embodiment of the present invention, the step of measuring may be the step of measuring the polarization voltage corresponding to a decrease in voltage of each of the plurality of battery cells in the vehicle battery for a present time interval immediately after the charging of the vehicle battery is terminated. In this embodiment, and the method may further include the steps of establishing an internal resistance of each of the plurality of battery cells based on the polarization voltage and a magnitude of a charging current applied to the vehicle battery immediately before the charging of the vehicle battery is terminated, and determining whether each of the battery cells is abnormal based on the estimated internal resistance.

In an embodiment of the present invention, the step of determining whether each of the battery cells is abnormal based on the estimated internal resistance may be the step of determining the battery cell in which a difference or ratio of the estimated internal resistance of each of the battery cells and a preset initial internal resistance of the battery cell is greater than a preset reference value as the battery cell in which abnormality is occurred.

In an embodiment of the present invention, the initial internal resistance is preset for each temperature and state of charge of the battery cells, and the step of determining whether each of the battery cells is abnormal based on the estimated internal resistance may be the step of receiving the temperature of each of the plurality of battery cells, calculating the state of charge of each of the plurality of battery cells, determining whether the battery cell is abnormal by applying the initial internal resistance corresponding to the received temperature and the calculated state of charge.

In an embodiment of the present invention, the method may further include the step of displaying on a cluster or audio video navigation (AVN) of the vehicle information including an identifier of the battery cell determined to be abnormal in the step of determining and a magnitude of the polarization voltage of the battery cell determined to be abnormal.

In an embodiment of the present invention, the step of displaying may include the step of wirelessly transmitting the information on the battery cell determined to be abnormal to a vehicle management server or a wireless terminal of a driver of the vehicle.

According to the system and method for managing a vehicle battery, whether a battery is abnormal may be determined prior to the occurrence of an accident by analyzing the voltage behavior characteristics of the battery in a no-load state in which the battery is electrically disconnected from a vehicle system after the vehicle battery is charged, so that it is possible to prevent problems that may occur in the battery, such as ignition of the battery, in advance.

The effects obtainable in the present invention are not limited to the above-mentioned effects, and other effects not mentioned will be clearly understood by those of ordinary skill in the art from the following description.

DETAILED DESCRIPTION OF THE INVENTION

Hereinafter, a system and method for managing a vehicle battery according to an embodiment of various embodiments of the present invention will be described in detail with reference to the accompanying drawings.

Figure 1:
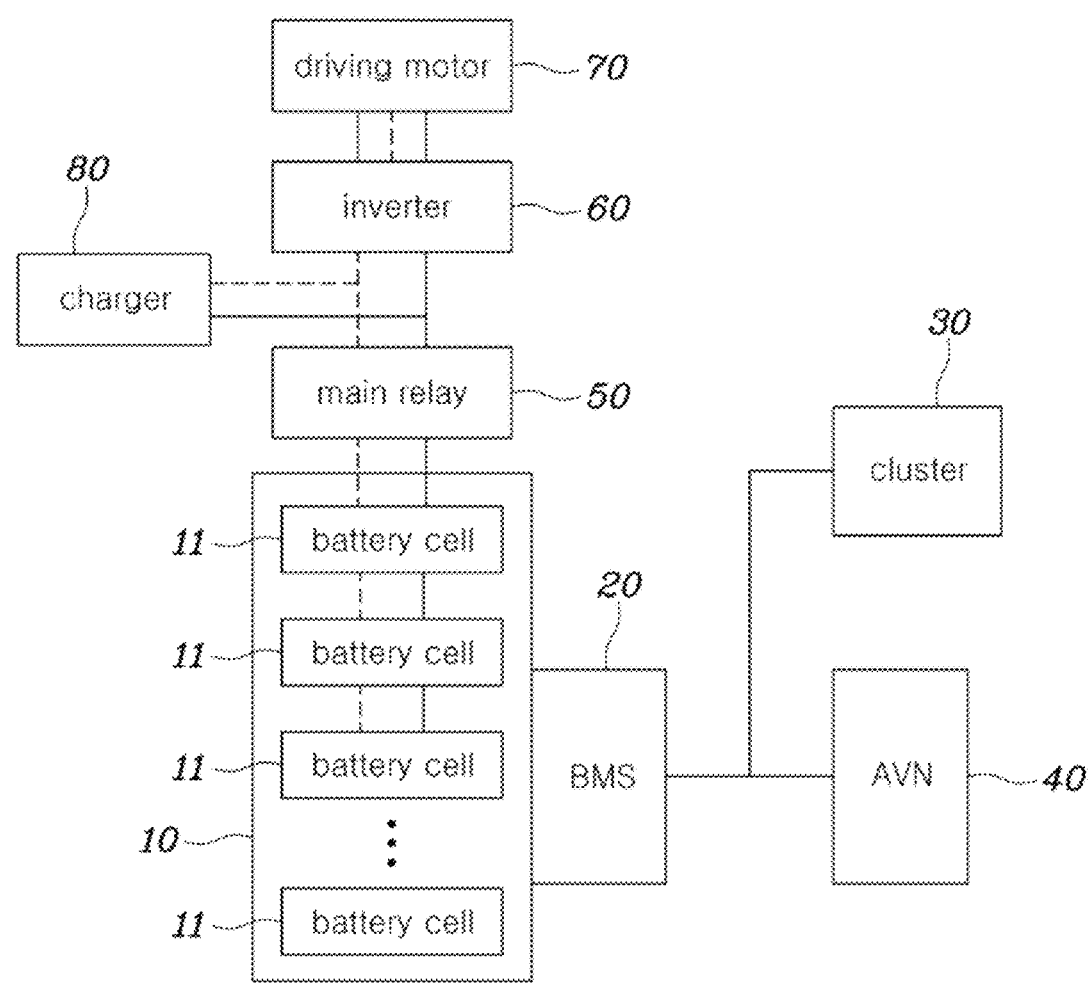
FIG. 1 is a block diagram of a system for managing a vehicle battery according to an embodiment of the present invention.

FIG. 1 is a block diagram of a system for managing a vehicle battery according to an embodiment of the present invention.

Referring to FIG. 1, a system for managing a vehicle battery according to an embodiment of the present invention may include a battery 10 that has a plurality of battery cells 11 and stores energy to be provided to a driving motor 70 of a vehicle, and a battery management system (BMS) 20 corresponding to a controller that monitors battery-related parameters such as voltage, current and temperature of the battery 10 and determines whether the battery is abnormal based on the monitored parameters.

In addition, the system for managing a vehicle battery according to an embodiment of the present invention may include a cluster 30 or an audio video navigation (AVN) 40 that displays the occurrence of abnormality to notify it to an external vehicle management server or a driver terminal, when it is determined that the abnormality of the battery is occurred in the battery management system 20.

In FIG. 1, the reference numeral '50' denotes a main relay that establishes or disconnects an electrical connection between the battery 10 and other components in the vehicle, and the reference numeral '60' denotes an inverter that converts the DC power stored in the battery 10 to the three-phase AC current used in the driving motor 70, and the reference numeral '80' denotes a charger that supplies charging power for charging the battery 10 to the battery.

In the description of the present invention, the parking state of the vehicle means a state in which the power of the vehicle is turned off after driving or charging of the vehicle is terminated, that is, a state in which the main relay 50 is opened. By opening the main relay 50, the battery 10 may be in a no-load state. Hereinafter, the vehicle power-off state, the parking state, and the no-load state of the battery 10 have substantially the same meaning and may be used overlappingly.

In one embodiment of the present invention, the battery management system 20 may determine whether the battery 10 is abnormal based on the voltage behavior of the battery 10. In more detail, the battery management system 20 may determine whether the battery 10 is abnormal based on the polarization voltage of each battery cell 11 in the battery 10.

Figure 2:
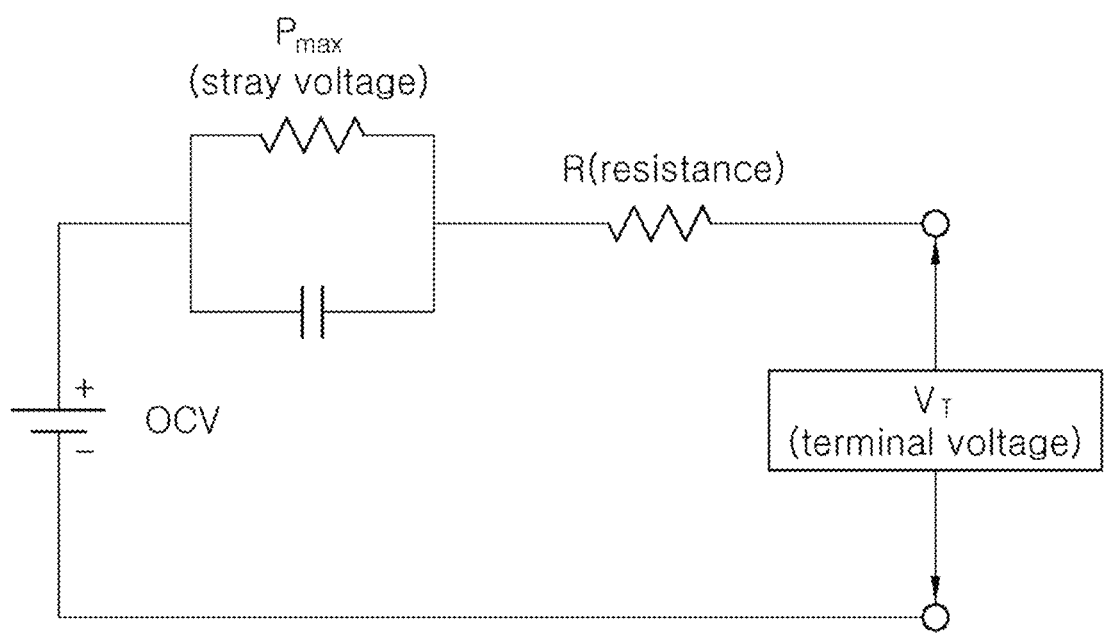
FIG. 2 is a circuit diagram illustrating an equivalent circuit model of a general battery.
Figure 3:
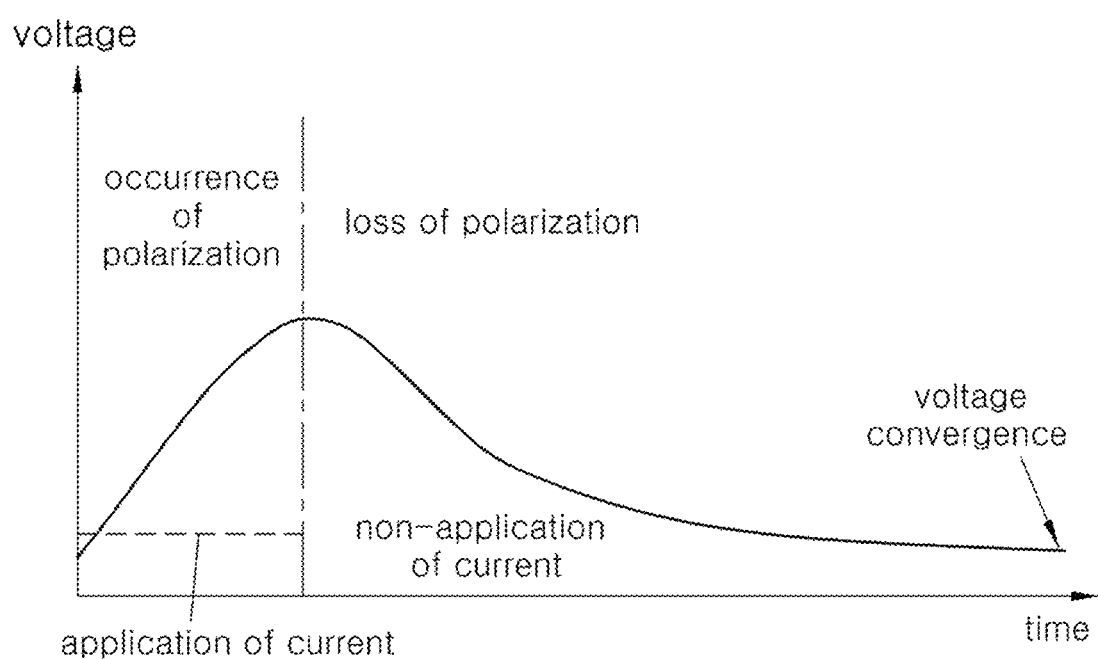
FIG. 3 is a graph illustrating a polarization voltage characteristic of a general battery.

FIGS. 2 and 3 are views for explaining a polarization voltage. FIG. 2 is a circuit diagram illustrating an equivalent circuit model of a general battery, and FIG. 3 is a graph illustrating a polarization voltage characteristic of a general battery.

When energy (current) is input to the battery for charging, the voltage of the battery exhibits a behavior as shown in FIG. 3. When a charging current is input to the battery, the voltage of the battery increases, and when a discharge current is input to the battery (when a current is output from the battery), the voltage of the battery decreases.

As shown in FIG. 2, a capacitor component and a resistance component exist inside the battery, and when a current is input to the battery, a voltage drop occurs due to the capacitor component and the resistance component. After the input charging current is cut off, the voltage of the battery gradually stabilizes and converges to a constant value as the voltage drop due to the capacitor component and the resistance component decreases.

In the relevant technical field, the amount of voltage changes of the battery that shows as described above after applying/cutting-off a current to the battery is referred to as a polarization voltage.

Various embodiments of the present invention determine whether the battery is abnormal based on the magnitude of the polarization voltage, that is, the polarization voltage measured for a predetermined time after the application of the battery charging current is stopped.

In particular, in various embodiments of the present invention, a short-term polarization voltage of the battery cell 11 is measured for a preset measurement time from a time point when the charging current applied to the battery 10 is cut off, a long-term polarization voltage of the battery cell 11 is measured for a plurality of sequentially preset time intervals after the measurement time in which the short-term polarization voltage is measured is terminated, and whether the battery cells 11 is abnormal is determined by comparing with a preset reference value for each of several measured polarization voltages.

Figure 4:
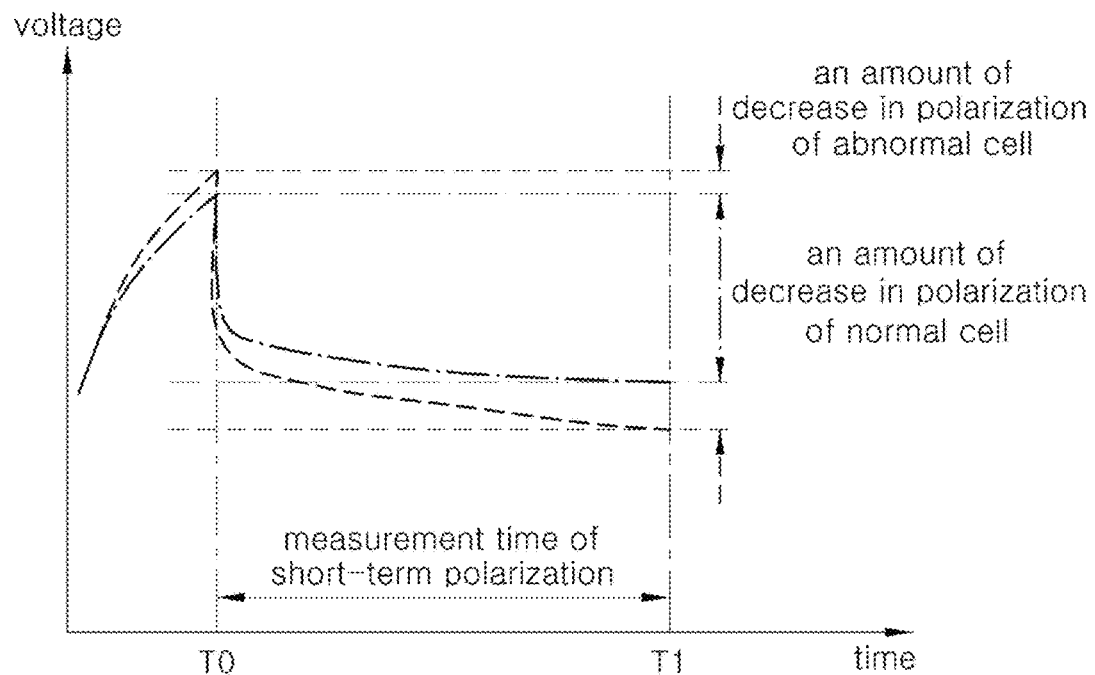
FIGS. 4 and 5 are graphs for explaining an example of a polarization voltage used in a system and method for managing a vehicle battery according to an embodiment of the present invention.
Figure 5:
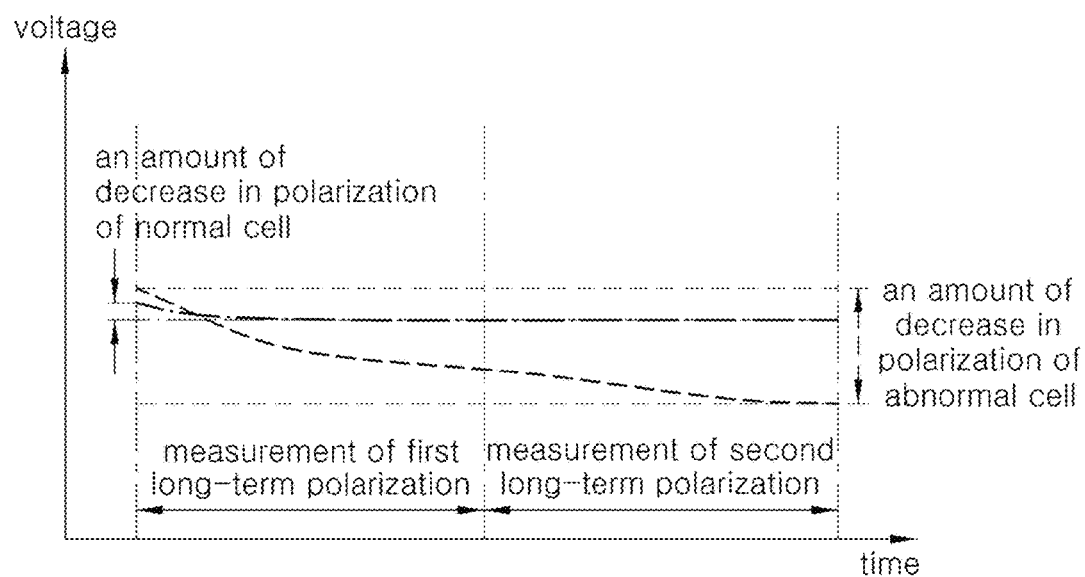

FIGS. 4 and 5 are graphs for explaining an example of a polarization voltage used in a system and method for managing a vehicle battery according to an embodiment of the present invention.

First, referring to FIG. 4, the battery management system 20 may measure the polarization voltages of the plurality of battery cells 11 in the battery cell 11 during a preset short-term polarization measurement time corresponding to a time interval from the time point (T0) when the charging of the battery is finished to a preset time point (T1).

As shown in FIG. 4, the polarization voltage of the battery cell in a normal state has a smaller value than the polarization voltage of the battery cell in an abnormal state. Therefore, a reference value for determining that the battery cell is in a normal state is set in advance by using an experimental method, and when the measured polarization voltage of the battery cell is greater than the preset reference value, it may be determined that abnormality is occurred in the battery cell.

In addition, as shown in FIG. 5, the battery management system 20 may measure the polarization voltage of the battery cell again at a time point (T3) when a preset time interval elapses from the time point (T2) after the time when the charging current application of the battery 10 is stopped and the short-term polarization voltage of the battery cell is measured, and then, may measure again the polarization voltage of the battery cell at a time point (T4) when a new preset time interval elapses.

That is, as shown in FIG. 4, the battery management system not only measures the short-term polarization voltage immediately after the charging current of the battery is cut off, but also measures again the polarization voltage (long-term polarization voltage) of the battery cell sequentially plural times after the short-term polarization voltage is measured and a certain period of time elapses. FIG. 5 shows that the long-term polarization voltage is measured twice, but this is only an example, and the number of times the long-term polarization voltage is measured can be appropriately adjusted as necessary.

The battery management system 20 may set and store in advance a reference value for determining the abnormality of the battery cell using the long-term polarization voltage through an experimental method, and when the measured long-term polarization voltage is greater than the reference value, it may be determined that abnormality is occurred in the battery cell.

Meanwhile, the polarization voltage may be different depending on the magnitude of the current applied to the battery 10. That is, when the magnitude of the charging current applied to the battery 10 is large, the voltage drop due to the internal resistance and internal capacitor of the battery as shown in FIG. 2 also increases, so it is necessary to consider the magnitude of the current to be applied to the battery 10 in determining whether the battery is abnormal using the polarization voltage.

Accordingly, in an embodiment of the present invention, the reference value compared with the measured polarization voltage may be previously set for each charging current of the battery 10, and the battery management system 20 may calculate an average charging current value applied to the battery before the charging current is cut off in determining the reference value for determining whether the battery is abnormal, and select the reference value based on the calculated average charging current value and compare the selected reference value with the polarization voltage. An example of a data map storing a reference value may be shown in Table 1 below.

TABLE 1

| average charging current | short-term polarization reference value | first long-term polarization reference value | second long-term polarization reference value |
|---|---|---|---|
| P(A) | A(mV) | B(mV) | C(mV) |
| Q(A) | D(mV) | E(mV) | F(mV) |
| ... | ... | ... | ... |

As shown in the table above, when the measured average charging current of the battery 10 is P ampere, the battery management system 20 may determine a reference value to be compared with the measured short-term polarization voltage as A millivolt, and a reference value to be compared with a first long-term polarization voltage as B millivolts, and the reference value to be compared with a second long-term polarization voltage as C millivolts.

On the other hand, in an embodiment of the present invention, the battery management system 20 may estimate an internal resistance of the battery cell 11 using the polarization voltage, and may determine whether the battery cell 11 is abnormal based on the magnitude difference or magnitude ratio of the estimated internal resistance and a preset initial internal resistance of the battery cell 11.

In the example shown in FIG. 4, the battery management system 20 may set the polarization voltage measurement time (T1) within 1 second from the time point (T0) when the battery charging current is cut off, and may measure the magnitude (Rn) of the internal resistance of the battery cell 11 according to Ohm's law using the charging current applied immediately before the charging current is cut off and the polarization voltage measured at the time point (T1). That is, the magnitude (Rn) of the internal resistance of the battery cell 11 may be estimated by dividing the measured polarization voltage by the charging current.

The battery management system 20 may determine the degree of deterioration of the battery cell 11 based on the difference or ratio between the magnitude of the estimated internal resistance and the magnitude (R0) of the initial internal resistance of the battery cell 11 measured in advance in the initial state of the battery cell 11 (e.g., the state of the battery cell immediately after shipment from a factory). When the difference or the ratio (Rn/R0) of the estimated internal resistance (Rn) of the battery cell 11 and the magnitude (R0) of the initial internal resistance is greater than a reference value determined in advance by an experimental method for determining battery deterioration, it may be determined that the degradation of the battery cell is occurred excessively.

Since the internal resistance of the battery cell 11 may be changed according to the temperature and state of charge (SOC) of the battery cell 11, the battery management system 20 may detect or calculate the temperature and state of charge of the battery cell 11, and the magnitude (RU) of the preset initial internal resistance may also be previously determined and stored for each temperature and state of charge of the battery cell, respectively, as shown in Table 2 below.

TABLE 2

| | 0% | 5% | ... | 95% | 100% |
|---|---|---|---|---|---|
| −30° C. | — | — | — | — | — |
| −20° C. | — | — | — | — | — |
| ... | | | | | |
| 40° C. | — | — | — | — | — |
| 50° C. | — | — | — | — | — |

Here, the temperature of the battery cell may be detected by a temperature sensor installed inside the battery and transmitted to the battery management system 20, and the state of charge of the battery cell may be calculated in the battery management system 20 using various parameters related to the battery cell such as a temperature and voltage of the battery using various known techniques in the relevant technical field.

Figure 6:
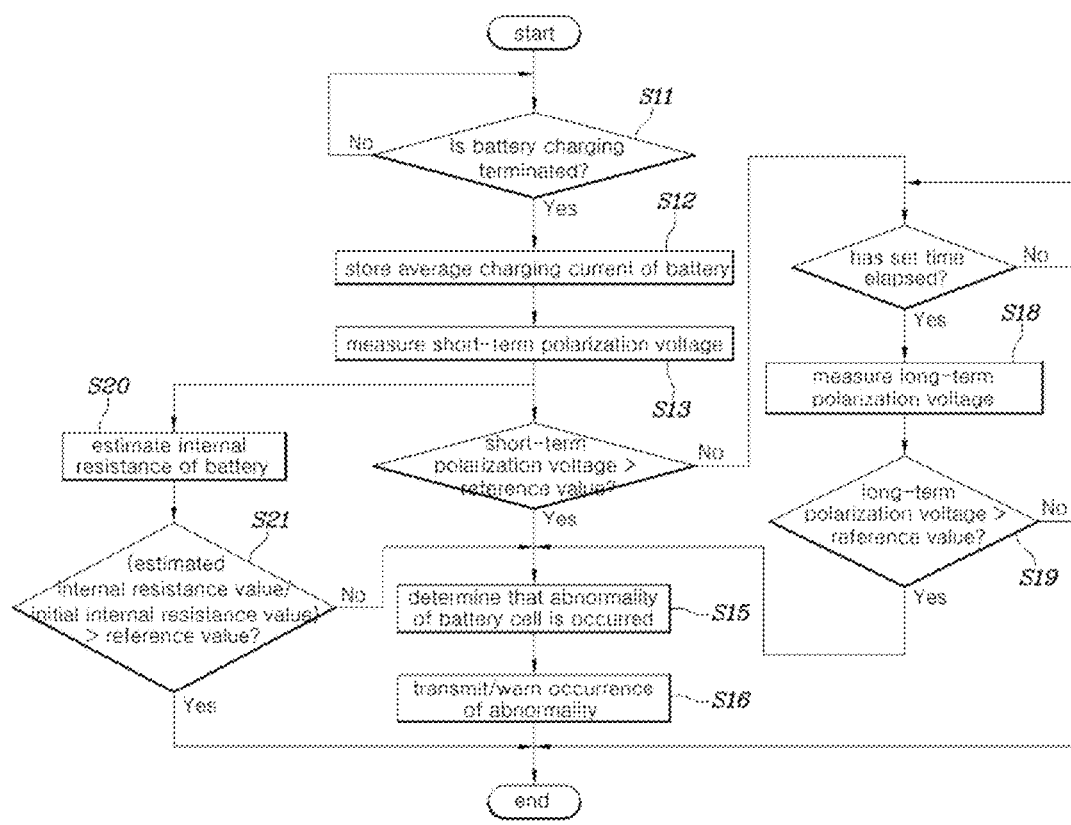
FIG. 6 is a flowchart illustrating a method for managing a vehicle battery according to an embodiment of the present invention.

FIG. 6 is a flowchart illustrating a method for managing a vehicle battery according to an embodiment of the present invention.

Referring to FIG. 6, a method for managing a vehicle battery according to an embodiment of the present invention may start from the step in which the battery management system 20, which is a controller, calculates and stores the average value of the charging current applied to the battery 10, and measures the polarization voltage corresponding to the decrease in voltage of each of the plurality of battery cells 11 in the battery 10 during a preset time interval (S13), when the battery 10 is in a no-load state in which the charging of the battery 10 is terminated, the charging current applied to the battery 10 is cut off, and the main relay 50 connected to the battery 10 is turned off (S11).

The polarization voltage measured in the step (S13) corresponds to the decrease in voltage of each of the battery cells 11 from the time point (T0) immediately after the charging of the battery 10 is terminated to the time point (T1) when the preset time interval has elapsed.

Next, the battery management system 20 may compare the polarization voltage measured in the step (S13) with a preset reference value (S14), and may determine that abnormality is occurred in the battery cell in which the magnitude of the polarization voltage is greater than the preset reference value (S15).

In the step (S16), the battery management system 20 may store the identifier (identification number) of the cell in which abnormality is occurred, the magnitude of the polarization voltage of the cell in which abnormality is occurred, and the like, and may display or send information on the cell in which abnormality is occurred in a later notification process.

Here, the abnormality of the battery cell means a state in which the desired electrical characteristics required for the battery cell cannot be expressed or can be predicted to fail due to various causes.

Next, the battery management system 20 may transmit the occurrence of abnormality in the battery cell to the cluster 30 or AVN 40 of the vehicle to display the occurrence of abnormality in the battery cell at the cluster 30 or the AVN 40 (S16). When the cluster 30 or the AVN 40 is equipped with a wireless communication module, the cluster 30 or the AVN 40 may notify the occurrence of abnormality in the battery cell to a remote vehicle management server or a wireless terminal of preregistered driver through the wireless communication module.

On the other hand, when the magnitude of the polarization voltage is less than or equal to the preset reference value as a result of comparing the polarization voltage measured in the step (S13) and the preset reference value, the battery management system 20 may measure the polarization voltage (long-term polarization voltage) for a preset time interval after a certain time elapses (S17, S18).

The certain time applied in the step (S17) may be 1 hour or more, but may be appropriately adjusted as necessary.

Next, the battery management system 20 may compare the polarization voltage measured in the step (S18) with a preset reference value (S19), and may determine that abnormality is occurred in the battery cell in which the magnitude of the polarization voltage is greater than the preset reference value (S15).

When the magnitude of the polarization voltage is greater than the reference value as a result of the comparison in the step (S14), as in the subsequent steps, the battery management system 20 transmits the occurrence of abnormality in the battery cell to the cluster 30 or AVN 40 of the vehicle to display the occurrence of abnormality in the battery cell on the cluster 30 or the AVN 40. When a wireless communication module is provided in the cluster 30 or the AVN 40, the cluster 30 or the AVN 40 may notify the occurrence of abnormality in the battery cell to a remote vehicle management server or a wireless terminal of a preregistered driver through the wireless communication module. Here, the notified information may include an identifier (identification number) of the cell in which abnormality is occurred, the magnitude of the polarization voltage of the cell in which abnormality is occurred, and the polarization voltage measurement order in which the occurrence of abnormality is determined.

FIG. 6 shows an example of measuring the long-term polarization voltage when no abnormality occurs as a result of comparing the short-term polarization voltage and the reference value, but in another example, even if abnormality is occurred as a result of comparing the short-term polarization voltage and the reference value, the long-term polarization voltage may be additionally measured. In addition, the number of the long-polarization voltage measurements may also be performed two or more times as needed.

Meanwhile, in an embodiment of the present invention, the abnormality (excessive deterioration) of the battery cell may be determined by selectively estimating the internal resistance of the battery cell.

After measuring the short-term polarization voltage (S13), the battery management system 20 may perform the step (S20) of estimating the internal resistance of the battery. Here, the short-term polarization voltage may correspond to a decrease in the voltage of the battery cell 11 measured within 1 second immediately after the battery charging current is cut off. In addition, in the step (S20), the battery management system 20 may store the magnitude of the charging current immediately before the charging current is cut off, and obtain or calculate the temperature of the battery cell 11 and the state of charge of the battery cell 11.

In the step (S20), the battery management system 20 may estimate the magnitude (Rn) of the internal resistance of the battery cell 11 by dividing the measured polarization voltage by the magnitude of the charging current immediately before the charging current is cut off.

Next, the battery management system 20 may determine the degree of deterioration of the battery cell 11 based on the ratio of the magnitude (Rn) of the estimated internal resistance and the magnitude (R0) of the initial internal resistance of the battery cell 11 measured in advance in the initial state of the battery cell 11 (S21). When the ratio (Rn/R0) of the estimated internal resistance (Rn) of the battery cell 11 and the magnitude (R0) of the initial internal resistance is greater than a reference value determined in advance by an experimental method for determining battery deterioration, it may be determined that the deterioration of the battery cell is excessively occurred.

When it is determined that the deterioration of the battery cell is occurred excessively, the same steps (S15 and S16) as described above may be performed to express and transmit the identifier of the battery cell in which the excessive deterioration is occurred and the degree of deterioration (the magnitude of the ratio (Rn/R0) of the estimated internal resistance (Rn) of the battery cell 11 and the magnitude (R0) of the initial internal resistance).

The magnitude (R0) of the initial internal resistance used in the step (S21) may be derived using a preset data map (corresponding to Table 2) based on the temperature and state of charge of the battery cell.

In addition, in the step (S21), the ratio (Rn/R0) of the internal resistance (Rn) of the battery cell 11 and the magnitude (R0) of the initial internal resistance is compared with the reference value, but the excessive deterioration of the battery may be determined by comparing the difference between the internal resistance (Rn) and the magnitude (R0) of the initial internal resistance with a preset reference value.

As described above, the system and method for managing a vehicle battery according to various embodiments of the present invention may determine whether a battery is abnormal by analyzing the voltage behavior characteristics of the battery, that is, a polarization voltage of the battery in a no-load state in which the battery is electrically disconnected from a vehicle system after the vehicle battery is charged.

Accordingly, the system and method for managing a vehicle battery according to various embodiments of the present invention may determine that abnormality is occurred in a battery prior to the occurrence of an accident due to various abnormalities in the battery, so that it is possible to prevent in advance the occurrence of a serious accident, such as a sudden ignition of a battery in a parked vehicle.

Although specific embodiments of the present invention have been illustrated and described above, it will be apparent to those skilled in the art that the present invention can be variously improved and changed within the scope of the claims.

| DESCRIPTION OF REFERENCE NUMERALS | |
|---|---|
| 10: battery | 11: battery cell |
| 20: battery management system (BMS) | |
| 30: cluster | |
| 40: AVN | 50: main relay |
| 60: inverter | 70: driving motor |
| 80: charger | |

What is claimed is:

1. A system for managing a vehicle battery that is chargeable/dischargeable and stores energy for driving a vehicle driving motor, the system comprising:
    a controller that measures a polarization voltage of each of a plurality of battery cells in a vehicle battery after charging of the vehicle battery is terminated, and determines whether each of the plurality of battery cells is abnormal based on the measured polarization voltage.

2. The system for managing a vehicle battery according to claim 1, wherein the controller measures the polarization voltage when a charging current applied to the vehicle battery is cut off and the vehicle battery is in a no-load state.

3. The system for managing a vehicle battery according to claim 1, wherein the controller compares the polarization voltage of each of the plurality of battery cells with a preset reference value, respectively, and determines the battery cell having the polarization voltage greater than the reference value as the battery cell in which abnormality is occurred.

4. The system for managing a vehicle battery according to claim 1, wherein the controller measures a first polarization voltage of each of the plurality of battery cells corresponding to a decrease in voltage of the vehicle battery for a preset time interval from a time point when the charging of the vehicle battery is terminated, and measures a second polarization voltage of each of the plurality of battery cells corresponding to the decrease in voltage of the vehicle battery at least once during the present time interval after measuring the first polarization voltage.

5. The system for managing a vehicle battery according to claim 3, wherein the controller compares a first polarization voltage of each of the plurality of battery cells with a preset first reference value, respectively, or compares a second polarization voltage of each of the plurality of battery cells with a preset second reference value, respectively, and determines the battery cell in which the first polarization voltage is greater than the first reference value or the second polarization voltage is greater than the second reference value as the battery cell in which abnormality is occurred.

6. The system for managing a vehicle battery according to claim 3, wherein the reference value is preset for each charging current of the vehicle battery, and when the charging of the vehicle battery is terminated, the controller calculates an average value of a charging current applied to the vehicle battery, and compares the reference value corresponding to the calculated average value of the charging current with the polarization voltage of each of the plurality of battery cells.

7. The system for managing a vehicle battery according to claim 1, wherein the controller measures the polarization voltage corresponding to a decrease in voltage of each of the plurality of battery cells in the vehicle battery for a present time interval immediately after the charging of the vehicle battery is terminated, establishes an internal resistance of each of the plurality of battery cells based on the polarization voltage and a magnitude of a charging current applied to the vehicle battery immediately before the charging of the vehicle battery is terminated, and determines whether each of the battery cells is abnormal based on the estimated internal resistance.

8. The system for managing a vehicle battery according to claim 7, wherein the controller determines the battery cell in which a difference or ratio of the estimated internal resistance of each of the battery cells and a preset initial internal resistance of the battery cell is greater than a preset reference value as the battery cell in which abnormality is occurred.

9. The system for managing a vehicle battery according to claim 1, further comprising a cluster or an audio-video navigation (AVN) that displays information on the battery cell determined to be abnormal by the controller.

10. The system for managing a vehicle battery according to claim 9, wherein the information includes an identifier of the battery cell determined to be abnormal and a magnitude of the polarization voltage of the battery cell determined to be abnormal.

11. The system for managing a vehicle battery according to claim 9, wherein the cluster or the AVN includes a communication module that wirelessly transmits the information on the battery cell determined to be abnormal to a vehicle management server or a wireless terminal of a driver of the vehicle.

12. A method for managing a vehicle battery that is chargeable/dischargeable and stores energy for driving a vehicle driving motor, the method comprising the steps of:
    measuring a polarization voltage of each of a plurality of battery cells in a vehicle battery after charging of the vehicle battery is terminated;
    comparing the measured polarization voltage with a present reference value;
    determining the battery cell in which the measured polarization voltage is greater than the reference value as the battery cell in which abnormality is occurred; and
    displaying information on the battery cell determined to be abnormal.

13. The method for managing a vehicle battery according to claim 12, wherein the step of measuring the polarization voltage is the step of measuring the polarization voltage when a charging current applied to the vehicle battery is cut off and the vehicle battery is in a no-load state.

14. The method for managing a vehicle battery according to claim 12, wherein the step of measuring the polarization voltage includes the steps of measuring a first polarization voltage of each of the plurality of battery cells corresponding to a decrease in voltage of the vehicle battery for a preset time interval from a time point when the charging of the vehicle battery is terminated, and measuring a second polarization voltage of each of the plurality of battery cells corresponding to the decrease in voltage of the vehicle battery at least once during the present time interval after measuring the first polarization voltage.

15. The method for managing a vehicle battery according to claim 14, wherein the step of comparing includes the step of comparing the first polarization voltage of each of the plurality of battery cells with a preset first reference value, respectively, or compares the second polarization voltage of each of the plurality of battery cells with a preset second reference value, respectively, and the step of determining includes the step of determining the battery cell in which the first polarization voltage is greater than the first reference value or the second polarization voltage is greater than the second reference value as the battery cell in which abnormality is occurred.

16. The method for managing a vehicle battery according to claim 12, wherein the step of measuring is the step of measuring the polarization voltage corresponding to a decrease in voltage of each of the plurality of battery cells in the vehicle battery for a present time interval immediately after the charging of the vehicle battery is terminated, and the method further comprises the steps of establishing an internal resistance of each of the plurality of battery cells based on the polarization voltage and a magnitude of a charging current applied to the vehicle battery immediately before the charging of the vehicle battery is terminated, and determining whether each of the battery cells is abnormal based on the estimated internal resistance.

17. The method for managing a vehicle battery according to claim 16, wherein the step of determining whether each of the battery cells is abnormal based on the estimated internal resistance is the step of determining the battery cell in which a difference or ratio of the estimated internal resistance of each of the battery cells and a preset initial internal resistance of the battery cell is greater than a preset reference value as the battery cell in which abnormality is occurred.

18. The method for managing a vehicle battery according to claim 12, further comprising the step of displaying the information on the battery cell determined to abnormal in the step of determining on a cluster or audio-video navigation (AVN) of the vehicle.

19. The method for managing a vehicle battery according to claim 18, wherein the information includes an identifier of the battery cell determined to be abnormal and a magnitude of the polarization voltage of the battery cell determined to be abnormal.

20. The method for managing a vehicle battery according to claim 18, wherein the step of displaying includes the step of wirelessly transmitting the information on the battery cell determined to be abnormal to a vehicle management server or a wireless terminal of a driver of the vehicle.

* * * * *